US007561853B2

(12) United States Patent  
Miyazawa

(10) Patent No.: US 7,561,853 B2  
(45) Date of Patent: Jul. 14, 2009

(54) RADIO FREQUENCY SWITCH

(75) Inventor: Naoyuki Miyazawa, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 535 days.

(21) Appl. No.: 11/034,755

(22) Filed: Jan. 14, 2005

(65) Prior Publication Data

US 2006/0160520 A1    Jul. 20, 2006

(30) Foreign Application Priority Data

Jan. 16, 2004    (JP) .............................. 2004-009878

(51) Int. Cl.  
H04B 1/44    (2006.01)
(52) U.S. Cl. .............................. 455/83; 455/78; 455/82; 327/382; 327/389; 327/427; 327/566; 257/275; 257/401; 257/48
(58) Field of Classification Search ................ 327/382, 327/389, 427, 566; 257/275, 401, 48; 455/78, 455/83, 82  
See application file for complete search history.

(56) References Cited

U.S. PATENT DOCUMENTS

| | | | | | |
|---|---|---|---|---|---|
| 4,635,088 | A | * | 1/1987 | Eguchi ........................ | 257/365 |
| 4,929,855 | A | * | 5/1990 | Ezzeddine .................. | 327/427 |
| 4,962,413 | A | * | 10/1990 | Yamazaki et al. ........... | 257/369 |
| 5,012,123 | A | * | 4/1991 | Ayasli et al. ................ | 307/112 |
| 5,276,371 | A | * | 1/1994 | Jinbo ......................... | 327/379 |
| 5,309,006 | A | * | 5/1994 | Willems et al. ............. | 257/275 |
| 5,313,083 | A | * | 5/1994 | Schindler .................... | 257/280 |
| 5,616,940 | A | * | 4/1997 | Kato et al. .................. | 257/206 |
| 5,818,283 | A | * | 10/1998 | Tonami et al. .............. | 327/436 |
| 5,973,377 | A | * | 10/1999 | Mizutani ..................... | 257/401 |
| 6,118,326 | A | * | 9/2000 | Singer et al. ................ | 327/390 |
| 6,218,890 | B1 | * | 4/2001 | Yamaguchi et al. ......... | 327/427 |
| 6,480,059 | B2 | * | 11/2002 | Dabral et al. ................ | 327/565 |
| 6,563,366 | B1 | * | 5/2003 | Kohama ...................... | 327/382 |
| 6,642,578 | B1 | * | 11/2003 | Arnold et al. ............... | 257/341 |
| 6,803,680 | B2 | * | 10/2004 | Brindle et al. .............. | 307/115 |
| 6,946,891 | B2 | * | 9/2005 | Asano et al. ................ | 327/318 |

(Continued)

FOREIGN PATENT DOCUMENTS

JP    2-238668 A    9/1990

(Continued)

OTHER PUBLICATIONS

Mitchell B. Shifrin et al., "Monolithic FET Structures for High-Power Control Component Applications", IEEE Transactions on Microwave Theory and Techniques, vol. 37, No. 12, pp. 2134-2141, Dec. 1989.

(Continued)

Primary Examiner—Lana N Le  
Assistant Examiner—RuiMeng Hu  
(74) Attorney, Agent, or Firm—Westerman, Hattori, Daniels & Adrian, LLP.

(57) ABSTRACT

A switch that selectively changes radio frequency signals includes at least three FETs, which are connected in series. The source electrodes or drain electrodes arranged at an intermediate stage have a width narrower than that of the source electrodes or the drain electrodes arranged at the initial and final stages. It is thus possible to lower the parasitic capacitance to ground at the intermediate stage and to thereby realize the switch having a high handling power.

5 Claims, 7 Drawing Sheets

U.S. PATENT DOCUMENTS

| | | | |
|---|---|---|---|
| 6,978,122 B2* | 12/2005 | Kawakyu et al. | 455/80 |
| 6,987,414 B2* | 1/2006 | Numata | 327/365 |
| 6,998,934 B2* | 2/2006 | Nakano | 333/103 |
| 7,129,767 B2* | 10/2006 | Brindle et al. | 327/436 |
| 7,138,846 B2* | 11/2006 | Suwa et al. | 327/308 |
| 7,307,298 B2* | 12/2007 | Yamane et al. | 257/280 |
| 7,339,210 B2* | 3/2008 | Asano et al. | 257/208 |
| 7,460,852 B2* | 12/2008 | Burgener et al. | 455/333 |
| 2004/0051114 A1 | 3/2004 | Brindle et al. | |
| 2005/0014473 A1* | 1/2005 | Zhao et al. | 455/83 |
| 2005/0047038 A1* | 3/2005 | Nakajima et al. | 361/58 |
| 2006/0194567 A1* | 8/2006 | Kelly et al. | 455/408 |

FOREIGN PATENT DOCUMENTS

| | | |
|---|---|---|
| JP | 3-278571 A | 12/1991 |
| JP | 7-70245 | 3/1995 |
| JP | 9-8621 | 1/1997 |
| JP | 11-136111 A | 5/1999 |

OTHER PUBLICATIONS

Japanese Office Action dated Apr. 10, 2007, issued in corresponding Japanese Application No. 2004-009878.

Chinese Office Action, First Office Action issued Aug. 22, 2008 for corresponding Chinese Patent Application No. 200510004519.8.

* cited by examiner

FIG. 3A                                              PRIOR ART
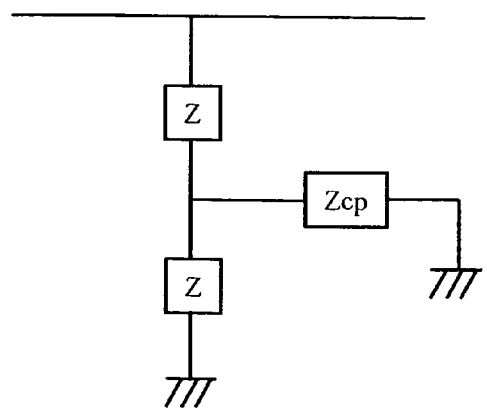
FIG. 3B
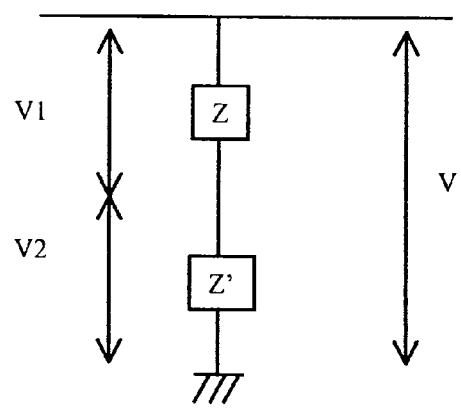
FIG. 4
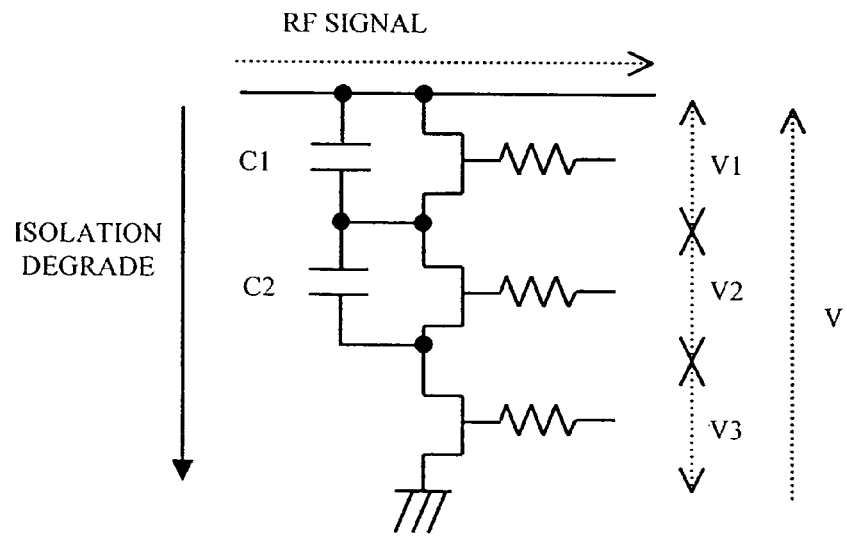

FIG. 7A
FIRST EMBODIMENT
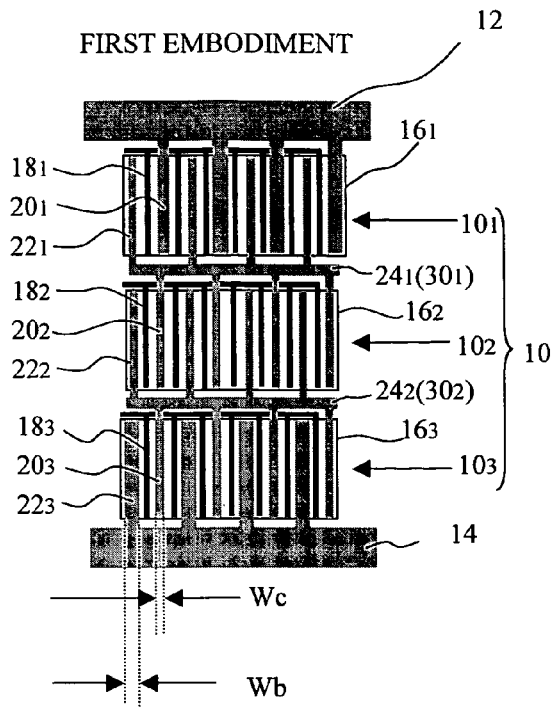
FIG. 7B
CONVENTIONAL TECHNIQUE
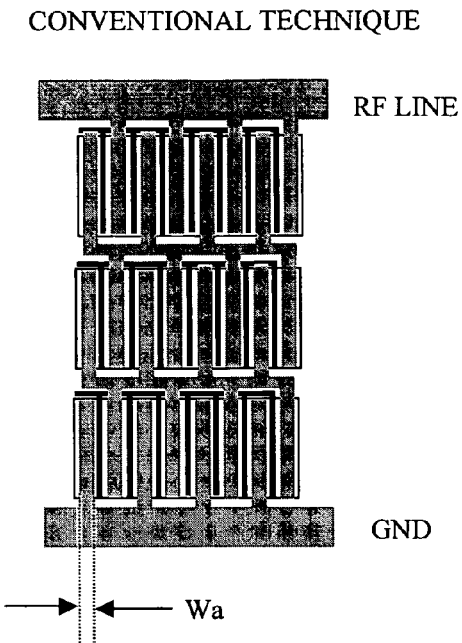
FIG. 8 2dB IS IMPROVED
(CONVENTIONNAL TECHNIQUE: 35dBm, PRESENT INVENTION 37dBm)
CONVENTIONNAL TECHNIQUE
Wa=3um
PRESENT INVENTION
Wb=2um Wc=5um
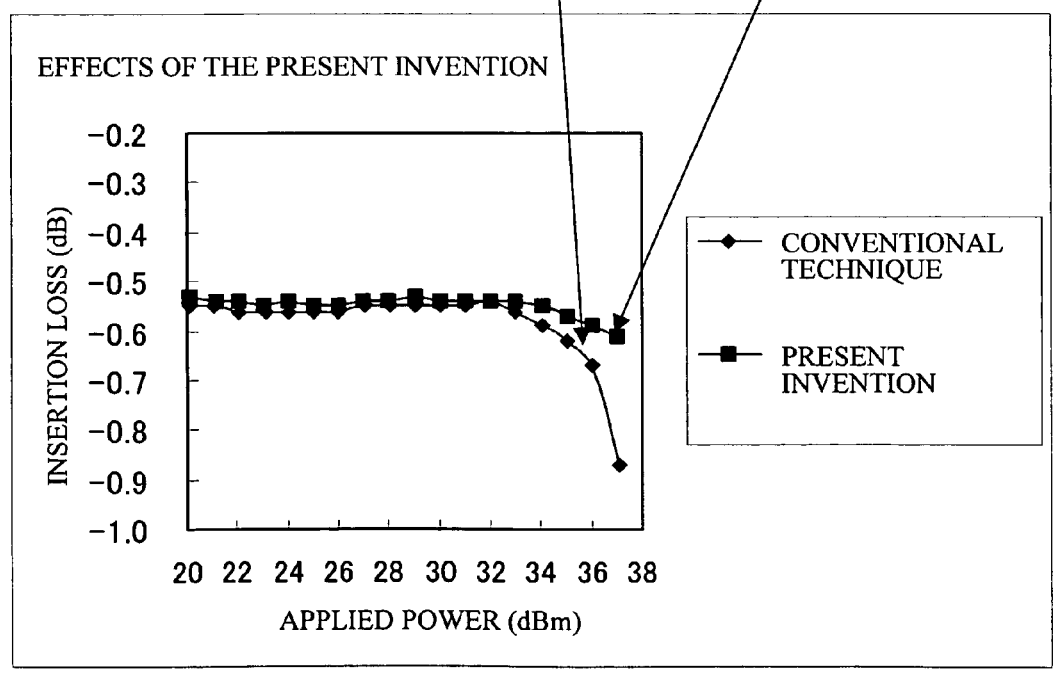

RADIO FREQUENCY SWITCH

BACKGROUND OF THE INVENTION

1. Field of the Invention

This invention generally relates to a radio frequency (RF) switch that is used for a radio frequency device such as a mobile telecommunications device, and more particularly, to the radio frequency switch on which multiple FETs are connected in series.

2. Description of the Related Art

In recent years, an RF switch having multiple ports (SPNT: Single Pole N-Through: N denotes the number of ports) has been employed in a mobile telephone unit, which communicates over multiple carrier signals. The RF switch includes a field-effect transistor (FET) composed of compound semiconductors. The RF switch is required to have a low harmonic performance, more specifically −70 dBc or less, to a fundamental harmonic of a transmitting signal. In order to suppress a harmonic component at a low level, the FET is required to improve linearity in the on-state resistance and to have an excellent off-state power.

In order to improve the off-state power, commonly, the FETs are connected in series at M stages. FIG. 1 shows an example of FETs connected in series at M stages. In the case where all the FETs are off, an RF signal passes through an RF signal line. In the case where all FETs are on, the RF signal passes across the FETs to the ground. In the case where all the FETs connected in series at M stages are off, each stage receives a voltage of 1/M theoretically. If the voltage of the RF signal is denoted by V, the voltage of V/M is applied to each of the FETs. However, in fact, each FET is affected by a parasitic capacitance to ground of the FET, which is denoted by Cp in FIG. 2. Referring to FIG. 2, Cds denotes a capacitance between the drain and source of each FET, and Cg denotes a capacitance between the gate and source or between the gate and drain of each FET. Referring to FIG. 3A, an impedance Zcp of the parasitic capacitance Cp to ground is connected to the impedance Z of the FET at each stage. Accordingly, as shown in FIG. 3B, the impedance at each stage is not equal (Z→Z'(<Z)). Because of the aforementioned impedance inequality among the stages, a voltage V1 is applied to the FET (the impedance Z) closest (or directly connected) to the RF signal line, in which the voltage V1 is greater than a voltage V2 (<V1) applied to the other stages (impedance Z' (<Z)). This results in a problem in that a handling power becomes smaller than a value calculated from the following logical formula 1.

$$P\max=2[M(Vp-V\text{cont})]^2/Zo \quad \text{(Formula 1)}$$

Here, M denotes the number of stages of the series connection, Vp denotes a pinch-off voltage at which the FET turns off from on or vise versa, Vcont is a control voltage applied to the gate of the FET, Zo is a system impedance, and Pmax is the maximum handling power.

In order to solve the aforementioned problem, as shown in FIG. 4, Mitchell B. Shifrin, et al. propose to add capacitances C1 and C2 to the stages to thus modify the parasitic capacitance to ground (see Mitchell B. Shifrin, et al., "Monolithic FET structures for High-Power Control Component Applications", IEEE Transactions on Microwave Theory and Technique, Vol. 37, No. 12, December 1989, pp. 2134-2141 (hereinafter referred to as Document 1)). By connecting the capacitances C1 and C2 in parallel with the FET, the impedance is equally divided at each stage and the high-frequency voltage V is equally divided into V1, V2, and V3. (V1=V2=V3).

Referring to FIGS. 5A and 5B, Japanese Patent Application Publication No. 8-70245 (hereinafter referred to as Document 2) and Japanese Patent Application Publication No. 9-8621 (hereinafter referred to as Document 3) disclose that a capacitance, Ca in FIG. 5A and another capacitance Cb in FIG. 5B, are respectively added between the source or drain and the gate, and the voltage divided between the gate and source is intentionally shifted. FIG. 6A shows changes of a voltage difference between V1 and V2 (V1−V2) and another voltage difference between V2 and V3 (V2−V3) in a case where the capacitances Ca and Cb are not added. FIG. 6B shows FIG. 6A shows changes of the voltage difference (V1−V2) and the voltage difference (V2−V3) in a case where the capacitances Ca and Cb are added as shown in FIGS. 5A and 5B. Here, V1 is the voltage of the RF signal, V2 is the voltage at a connection point between the capacitance Ca and the gate, and V3 is the voltage at a node that connects the two FETs in series. A symbol Vp in FIGS. 6A and 6B denotes the pinch-off voltage. The use of the additional capacitances Ca and Cb shifts the voltage divided between the gate and source. Even if the RF voltage has a large amplitude, the voltage can be offset so that the gate voltage may not exceed the pinch-off voltage Vp. Thus, the handling power is improved.

However, the conventional technique disclosed in Document 1 and shown in FIG. 4 has a problem in which a signal is leaked through the capacitances C1 and C2. This leakage current degrades isolation at the time of switching off. Costs are increased in the capacitance formation process. In addition, in case where the capacitances C1 and C2 have a low breakdown voltage, the surge resistance such as ESD may be degraded. Generally, a capacitance on an MMIC has a low breakdown voltage.

The conventional techniques disclosed in Documents 2 and 3, shown in FIGS. 5A and 5B, also have the same problem as that in Document 1. Additionally, there is still another problem in that the FETs are required to have a high breakdown voltage, as compared to the circuit without the capacitances Ca and Cb.

Further, in recent years HEMT has been used instead of MESFET in order to reduce the insertion loss of the switch. Generally, when the on-state resistance is lowered, the breakdown voltage tends to be lowered due to a highly concentrated channel layer. Therefore, it is no longer possible to solve the above-mentioned problems with the conventional techniques disclosed in Documents 1 through 3, which have the problems in terms of the breakdown voltages.

SUMMARY OF THE INVENTION

It is a general object of the present invention to solve the above-mentioned problems and provide a radio frequency switch. More specifically, the voltage applied to the FETs connected in series in the off state is equally divided, and the handling power is improved easily and at a low cost.

According to an aspect of the present invention, preferably, there is provided a switch comprising at least three FETs that are connected in series and select one of allowing radio frequency signals from one end to travel toward another end and allowing the radio frequency signals from said one end to pass across all of said at least three FETs, and one of the at least three FETs arranged at an intermediate stage having a width of a source or drain electrode narrower than widths of source or drain electrodes of other FETs arranged at initial and final stages. It is thus possible to reduce the parasitic capacitance to ground at the intermediate stage and thereby realize the improved handling power readily and at a low cost with the off-FETs connected in series.

On the above-mentioned configuration, the radio frequency switch comprises at least four FETs connected in series. Ones of the at least four FETs arranged on intermediate stages having widths of source or drain electrodes narrower than those of the source or drain electrodes arranged at the initial and final stages. Preferably, a total width of gate electrodes of the FETs except those arranged at the initial and final stages is smaller than that of gate electrodes of the FETs arranged at the initial and final stages. In addition, the above-mentioned configuration may further include electrode lines that extend along gate electrodes of the at least three FETs, and the electrode lines of the FETs except those arranged at the initial and final stages is shorter than that of the electrode lines of the FETs arranged at the initial and final stages.

BRIEF DESCRIPTION OF THE DRAWINGS

Preferred embodiments of the present invention will be described in detail with reference to the following drawings, wherein:

FIGS. 3A and 3B are circuit diagrams illustrating a parasitic capacitance to ground and a drawback because thereof;

FIG. 4 is a circuit diagram of a conventional RF switch that solves the drawback shown in FIGS. 3A and 3B;

FIG. 7 is a plain view of an RF switch in accordance with a first embodiment of the present invention;

FIG. 8 is a graph describing a relationship between applied power and insertion loss observed in the first embodiment of the present invention in contrast to the prior art;

DESCRIPTION OF THE PREFERRED EMBODIMENTS

Figure 1:
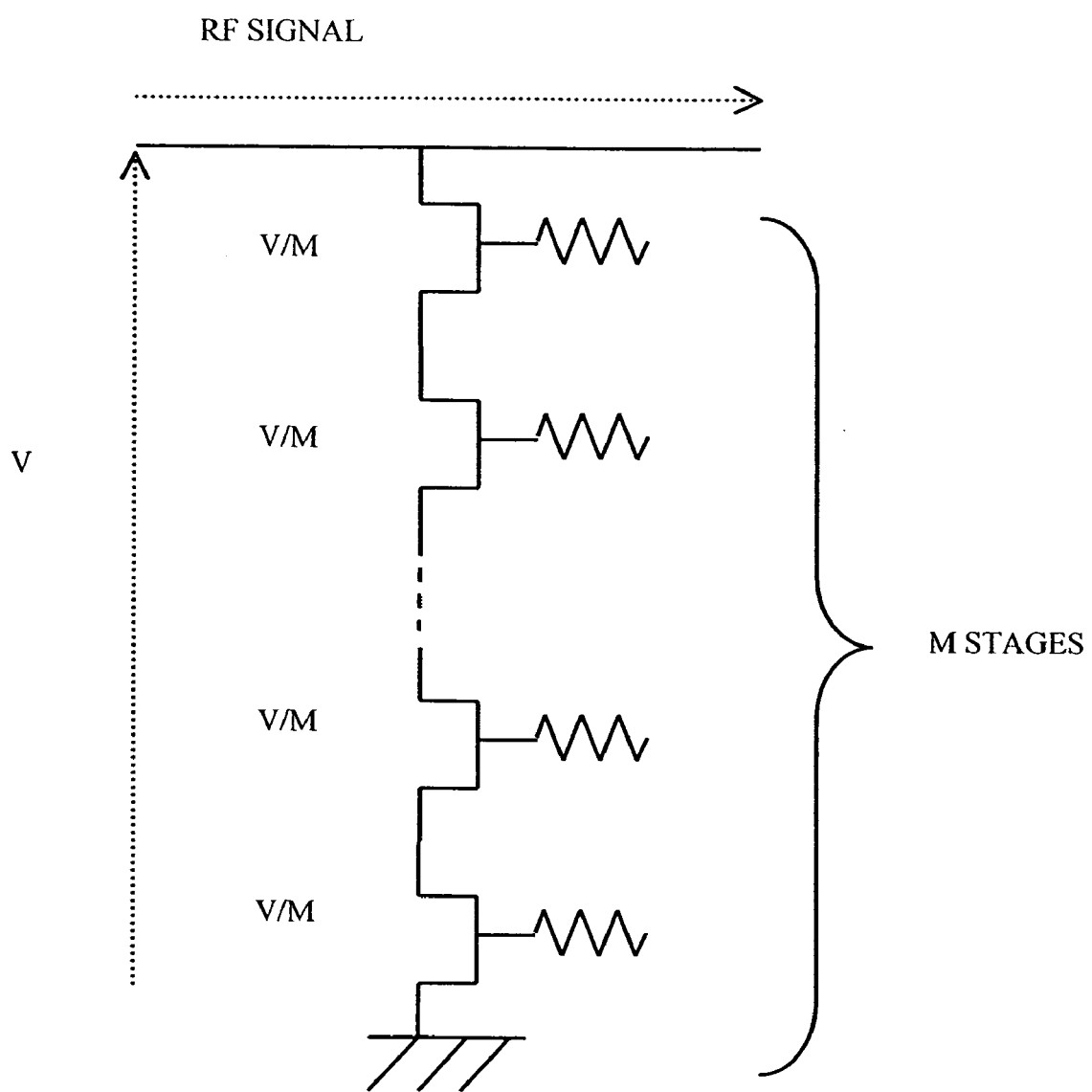
FIG. 1 shows an example of FETs connected in series at M stages.

A description will now be given, with reference to the accompanying drawings, of embodiments of the present invention.

First Embodiment

FIG. 7A is a plan view of an RF switch in accordance with a first embodiment of the present invention. The RF switch in FIG. 7A includes FETs connected in series at three stages. FIG. 7B shows a conventional RF switch having the FETs connected in series at three stages. As will be described below, the width of an electrode interconnection that is connected to a source or drain of the FET at an intermediate (second) stage is narrower than another electrode interconnection that is connected to the source or drain of the FET at an initial (first) stage and an RF line or that is connected to the source or drain of the FET at a final (third) stage and a ground line. The electrode interconnection that is connected to the source of the FET is referred to as a source electrode. The electrode interconnection that is connected to the drain of the FET is referred to as a drain electrode.

Three FETs $10_1$, $10_2$, and $10_3$ are arranged in three separate FET-forming regions $16_1$, $16_2$, and $16_3$ provided in a compound semiconductor substrate such as GaAs. The compound semiconductor substrate corresponds to a sheet of FIG. 7A. These FETs are referred to as an FET group 10. Each of the FETs $10_1$, $10_2$, and $10_3$ connected in series in the FET-forming regions $16_1$, $16_2$, and $16_3$ includes multiple FETs connected in parallel. There are seven FETs in each of the FET-forming regions $16_1$, $16_2$, and $16_3$ as shown in FIG. 7A. The FETs $10_1$, $10_2$, and $10_3$ are connected in series between an RF line 12 and a ground (GND) line 14. The FET $10_1$ is directly connected to the RF line 12. The FET $10_3$ is directly connected to the GND line 14. The FET $10_2$ is connected between the FET $10_1$ and the FET $10_3$.

A source/drain electrode interconnection (hereinafter referred to as S/D electrode interconnection) $20_1$ extends vertically on the FET-forming region $16_1$ from the RF line 12. An S/D electrode interconnection $22_1$ is arranged on the FET-forming region $16_1$. A gate electrode interconnection $18_1$ is arranged between the S/D electrode interconnections $20_1$ and $22_1$. The S/D electrode interconnections $20_1$ and $22_1$ respectively face the gate electrode interconnection $18_1$ in the opposite directions. The S/D electrode interconnection $22_1$ is connected to an S/D electrode interconnection $20_2$, which is arranged on the FET-forming region $16_2$ at the second stage, by way of a linkup electrode interconnection $24_1$ that extends parallel to the RF line 12. The S/D electrode interconnection $20_2$, the linkup electrode interconnection $24_1$, and the S/D electrode interconnections $22_1$ form a continuous interconnection pattern, which is connected to the source or drain of the FET $10_2$ at the second stage in the series circuit of the three FETs. This continuous interconnection pattern including $22_1$, $24_1$, and $20_2$ is indicated by a reference numeral $30_1$.

An S/D electrode interconnection $22_2$ and the S/D electrode interconnection $20_2$ are arranged in the FET-forming region $16_2$. A gate electrode interconnection $18_2$ is arranged between the S/D electrode interconnections $20_2$ and $22_2$. The S/D electrode interconnections $20_2$ and $22_2$ respectively face the gate electrode interconnection $18_2$ in opposite directions. The S/D electrode interconnection $22_2$ is connected to an S/D electrode interconnection $20_3$ that is arranged in the FET-forming region $16_3$ at the third stage, by way of a linkup electrode interconnection $24_2$ that extends parallel to the RF line 12. The S/D electrode interconnection $22_2$, the linkup electrode interconnection $24_2$, and the S/D electrode interconnections $20_3$ are a continuous interconnection pattern, which is connected to source or drain of the FET $10_2$ at the second stage of the series circuit. This continuous interconnection pattern including $22_2$, $24_2$, and $20_3$ is indicated by a reference numeral $30_2$.

An S/D electrode interconnection $22_3$ and the S/D electrode interconnection $20_3$ are arranged on the FET-forming region $16_3$. The S/D electrode interconnection $22_3$ extends from the GND line 14. A gate electrode interconnection $18_3$ is arranged between the S/D electrode interconnections $20_3$ and $22_3$. The S/D electrode interconnections $20_3$ and $22_3$ respectively face the gate electrode interconnection $18_3$ in opposite directions.

Figure 2:
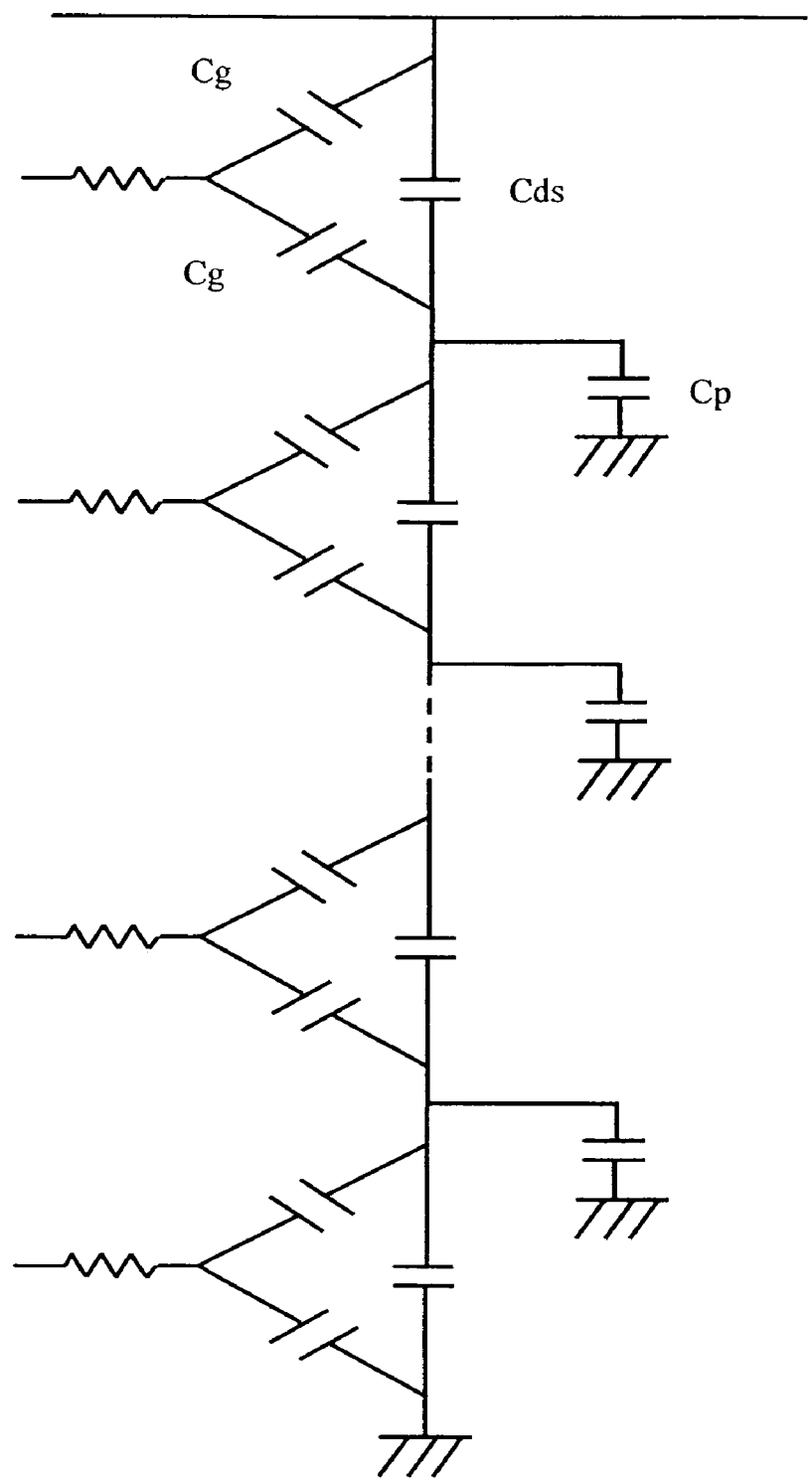
FIG. 2 shows an equivalent circuit of an RF switch.
Figure 5A:
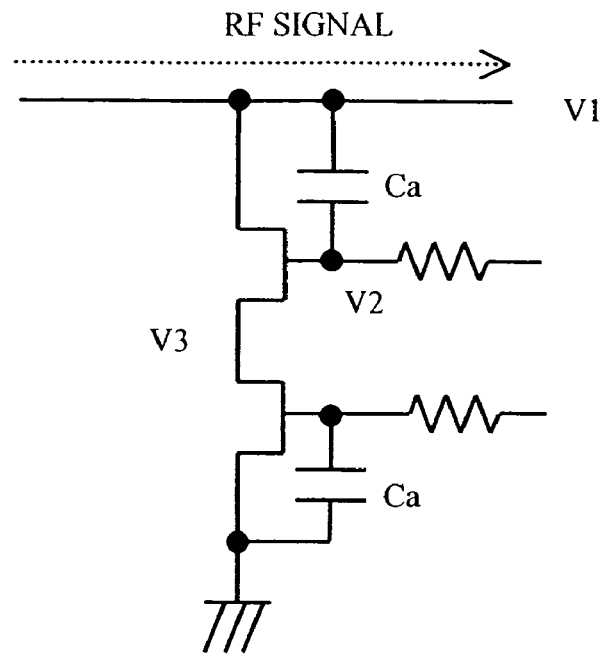
FIG. 5 is another circuit diagram of the conventional RF switch that solves the drawback shown in FIGS. 3A and 3B.
Figure 5B:
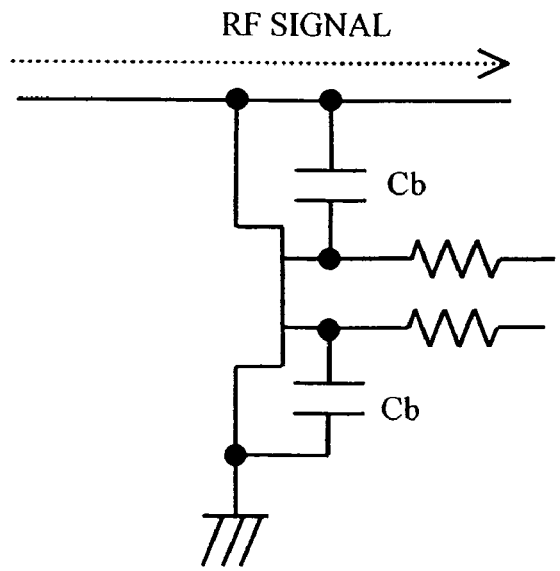
Figure 6A:
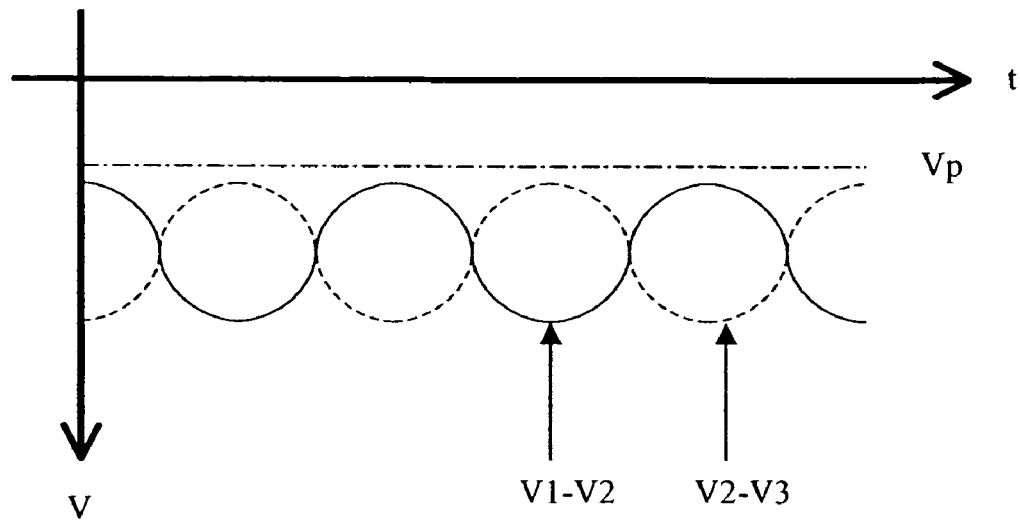
FIGS. 6A and 6B are waveform diagrams llustrating operations of the RF switch shown in FIG. 5.
Figure 6B:
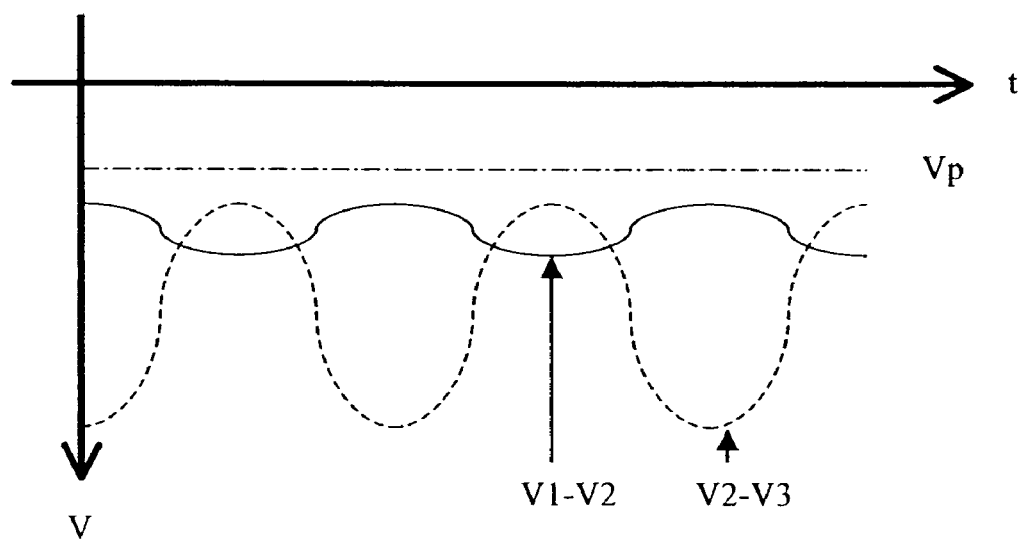

In accordance with the first embodiment of the present invention, the parasitic capacitance Cp to ground is reduced by making the electrode interconnections thin. The electrode interconnections generate the parasitic capacitance Cp to ground. As shown in an equivalent circuit in FIG. 2, the parasitic capacitance Cp to ground, which brings inequality in applied voltages, corresponds to the drain or source at the second stage in the series-connected circuit. The electrodes connected to the RF line 12 or the ground line 14 are not involved in the inequality in applied voltages. The first embodiment of the present invention focuses on this point.

The widths of the S/D electrode interconnections $30_1$ and $30_2$ are thinner than those of the S/D electrode interconnections $20_1$ and $22_3$. The S/D electrode interconnections $30_1$ and $30_2$ are connected to the source or drain at the second stage. The S/D electrode interconnection $20_1$ is connected to source or drain of the FET $10_1$ and the RF line 12 at the first stage. The S/D electrode interconnection $22_3$ is connected to the source or drain of the FET $10_3$ and the GND line 14 at the third stage.

A condition such that Wc is smaller than Wb (Wc<Wb) where Wc denotes the widths of the S/D electrode interconnections $30_1$ and $30_2$, and Wb denotes the widths of the S/D electrode interconnections $20_1$ and $22_3$. FIG. 8 shows values of input power (dBm) and insertion loss (dB) actually measured under the condition such that Wc is 2 μm and Wb is 5 μm. FIG. 7B is a plan view of a comparative conventional RF switch in which all the S/D electrode interconnections have an identical width Wa of 3 μm. For comparison, FIG. 8 also shows the FET characteristics of the conventional RF switch in FIG. 7B. Referring to FIG. 8, if the insertion loss is degraded by 0.1 dB, the applied power is 35 dBm in the conventional circuit. In contrast, the first embodiment of the present invention achieves an approximately 2 dB improvement since the insertion loss is degraded by 0.1 dB for an applied power of 37 dBm.

As described above, it is thus possible to realize the RF switch having an improved high handling power, by lowering the parasitic capacitance Cp to ground without costly additional capacitances and degrading the surge resistance.

Referring back to FIG. 7A, the S/D electrode interconnections $30_1$ and $30_2$ have the identical width Wc. Alternatively, the linkup electrode interconnection $24_1$ and $24_2$ may be slightly thicker than those of the other S/D electrode interconnections. That is, the S/D electrode interconnections $30_1$ and $30_2$ may have different widths. The parasitic capacitance Cp to ground can be reduced as long as the S/D electrode interconnections $30_1$ and $30_2$ have areas smaller than those in the conventional circuit.

The present invention is not limited to the three-stage series circuit shown in FIG. 7A, but an arbitrary number of stages may be employed. For instance, a five-stage series circuit may be employed in which the S/D electrode interconnections at the second through fourth stages have the width Wc and those at the first and fifth stages connected to the RF line and GND line have the width Wb (Wc<Wb).

Second Embodiment

Figure 9:
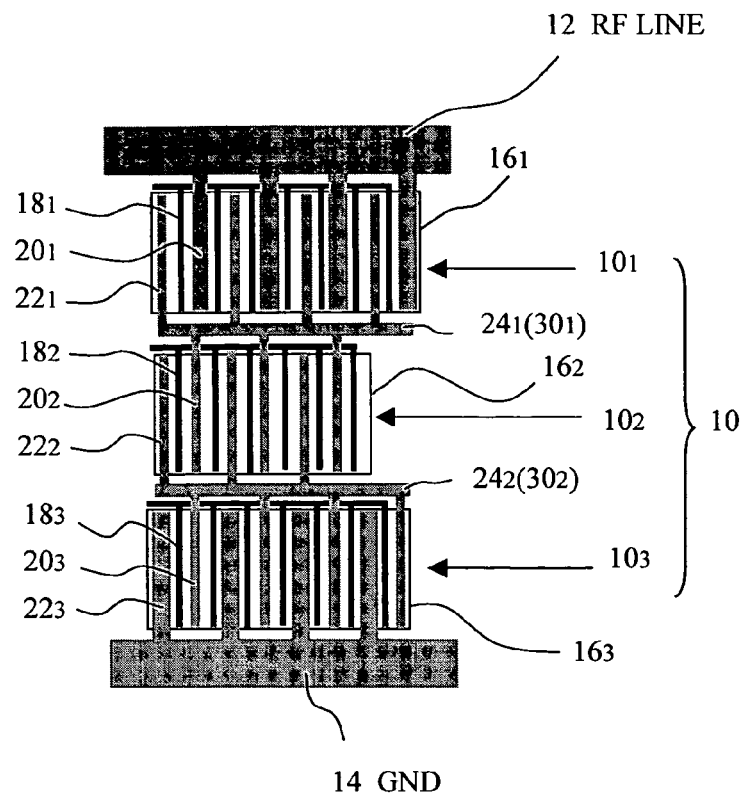
FIG. 9 is a plan view of an RF switch in accordance with a second embodiment of the present invention.

FIG. 9 is a plan view of an RF switch in accordance with a second embodiment of the present invention. Hereinafter, in the second embodiment, the same components and configurations as those of the first embodiment have the same reference numerals. In accordance with the second embodiment of the present invention, the total gate width of the FETs that are arranged in the FET-forming regions $16_2$ at the intermediate (second in the present embodiment) stage(s) is configured to be smaller than the total gate width of the FETs at the initial and final stages. More specifically, each of the FET-forming regions $16_1$ and $16_3$ includes seven FETs. In contrast, the FET-forming region $16_2$ includes six FETs. It is thus possible to reduce the total area of the S/D electrode interconnections $30_1$ and $30_2$, as compared to that in the circuit shown FIG. 7A, and to thereby further reduce the parasitic capacitance Cp to ground. This makes it possible to realize the RF switch having a higher handling power, by lowering the parasitic capacitance Cp to ground without costly additional capacitances and degrading the surge resistance.

Third Embodiment

Figure 10:
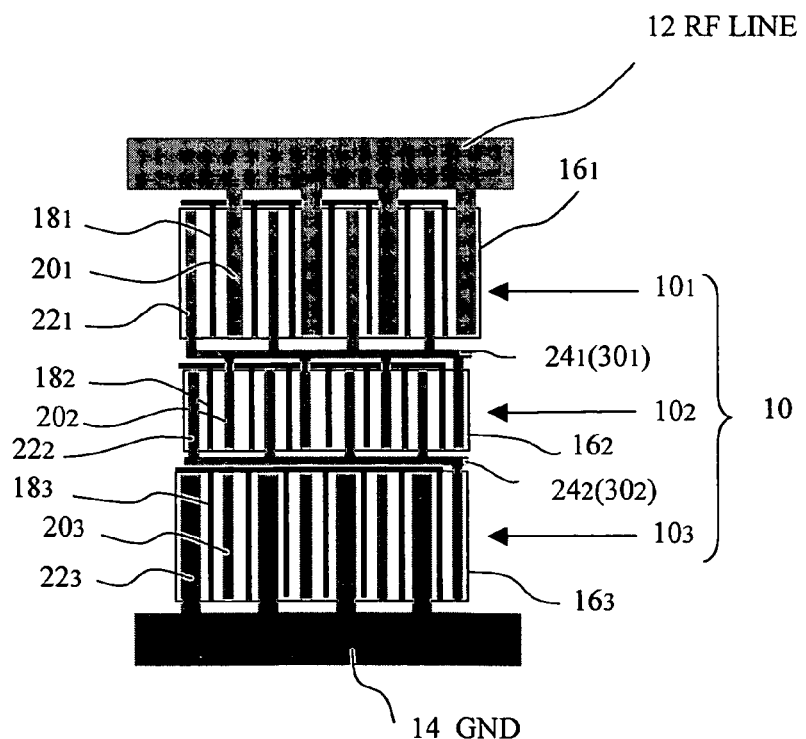
FIG. 10 is a plain view of an RF switch in accordance with a third embodiment of the present invention.

FIG. 10 is a plain view of an RF switch in accordance with a third embodiment of the present invention. Hereinafter, in the second embodiment, the same components and configurations as those of the first embodiment have the same reference numerals. The third embodiment has an arrangement in which the FETs arranged in the FET-forming regions $16_2$ at the second (intermediate) stage have a size smaller than that of the FETs at the first and third stage. It is thus possible to further reduce the parasitic capacitance Cp to ground, by shortening the total length of the S/D electrode interconnections $30_1$ and $30_2$. This makes it possible to realize the RF switch having a higher handling power, by lowering the parasitic capacitance Cp to ground without costly additional capacitances and degrading the surge resistance. The third embodiment may be combined with the second embodiment of the present invention.

The present invention is not limited to the above-mentioned embodiments, and other embodiments, variations and modifications may be made without departing from the scope of the present invention.

The present invention is based on Japanese Patent Application No. 2004-009878 filed on Jan. 16, 2004, the entire disclosure of which is hereby incorporated by reference.

What is claimed is:

1. A switch comprising:
    at least three FETs that allow radio frequency signals from one end to travel toward another end and allow the radio frequency signals from said one end to pass across all of said at least three FETs,
    said at least three FETs being connected in series between a node and a ground wherein said node is connected between said one end and said another end, wherein:
    a drain electrode of one of the at least three FETs arranged at an initial stage is connected to said node, and a source electrode of one of the at least three FETs arranged at a final stage is connected to the ground;
    a drain electrode of one of the at least three FETs arranged at an intermediate stage is connected to a source electrode of the one of the at least three FETs arranged at the initial stage, and a source electrode of the one of the at least three FETs arranged at the intermediate stage is connected to a drain electrode of the one of the at least three FETs arranged at the final stage;
    widths of both of the drain and source electrodes of the one of the at least three FETs arranged at the intermediate stage is less than the width of the drain electrode of the one of the at least three FETs arranged at the initial stage and the width of the source electrode of the one of the at least three FETs arranged at the final stage; and
    means for selecting said at least three FETs to allow the radio frequency signals from said one end to travel toward said another end in the case that all of said at least three FETs are off, and allow the radio frequency signals to pass across all of said at least three FETs from said one end to the ground in the case that all of said at least three FETs are on.

2. The switch as claimed in claim 1, wherein the radio frequency switch comprises at least four FETs connected in series.

3. The switch as claimed in claim 2, wherein source and drain electrodes of one of at least four FETs arranged on intermediate stages have widths of source and drain electrodes narrower than the width of the drain electrode connected to said node and the width of the source electrode connected to the ground.

4. The switch as claimed in claim 1, wherein a total width of gate electrodes of the FETs except those arranged at the initial and final stages is smaller than that of gate electrodes of the FETs arranged at the initial and final stages.

5. The switch as claimed in claim 1, further comprising a linkup interconnection line connected to the source or drain electrode of one of the at least three FETs arranged at the intermediate stage is shorter than that of other linkup interconnection line connected to the source or drain electrode of the FET at the initial or final stage.

* * * * *